United States Patent [19]

Taguchi et al.

[11] Patent Number: 5,204,223

[45] Date of Patent: Apr. 20, 1993

[54] PHOTOSENSITIVE RESIN COMPOSITION

[75] Inventors: Yuji Taguchi; Toshiaki Fujimura, both of Ohtsu, Japan

[73] Assignee: Toyo Boseki Kabushiki Kaisha, Osaka, Japan

[21] Appl. No.: 742,046

[22] Filed: Aug. 8, 1991

[30] Foreign Application Priority Data

Aug. 9, 1990 [JP] Japan .................................. 2-212117
Jul. 3, 1991 [JP] Japan .................................. 3-190544
Jul. 16, 1991 [JP] Japan .................................. 3-175141

[51] Int. Cl.$^5$ ........................ C08F 2/50; G03F 7/031; G03F 7/035
[52] U.S. Cl. ................................ 430/281; 430/906; 522/135; 522/142
[58] Field of Search ................. 430/281, 906; 522/142, 522/135

[56] References Cited

U.S. PATENT DOCUMENTS

| | | | |
|---|---|---|---|
| 2,948,611 | 8/1960 | Barney | 522/142 |
| 4,145,222 | 3/1979 | Etoh et al. | 430/906 |
| 4,337,307 | 6/1982 | Neubauer | 430/906 |
| 4,544,624 | 10/1985 | Nanpei et al. | 430/281 |
| 4,999,279 | 3/1991 | Takenaka | 430/906 |

FOREIGN PATENT DOCUMENTS

A1-0348063 6/1989 European Pat. Off. .
3287943 11/1988 Japan .................................. 430/281

Primary Examiner—Marion E. Mc Camish
Assistant Examiner—Susan Berman
Attorney, Agent, or Firm—Leydig, Voit & Mayer

[57] ABSTRACT

A photosensitive resin composition which is excellent in flexibility and impact resilience, which is less affected by humidity is provided. This composition comprises a soluble synthetic polymer, a photo-polymerizable unsaturated compound, and a photo-polymerization initiator, wherein the soluble synthetic polymer comprises an addition polymer obtained by the reaction between a diamine compound having amino groups selected from primary and secondary amino groups and having no amide bonds in its molecule and a diisocyanate compound; and the addition polymer contains a polyoxyalkylene glycol component in an amount of 20 to 80% by weight.

3 Claims, No Drawings

PHOTOSENSITIVE RESIN COMPOSITION

BACKGROUND OF THE INVENTION

1. Field of the Invention

The present invention relates to a photosensitive resin composition, and more particularly to a photosensitive resin composition excellent in properties such as flexibility and impact resilience, which is less affected by humidity.

2. Description of the Prior Art

In the past, a photosensitive resin composition (hereinafter, referred to as a composition) comprising as basic components a soluble synthetic polymer, a photopolymerizable unsaturated compound, and a photopolymerization initiator has widely been used in the fields such as relief plates for various kinds of printing, relief masks for sand blasting, design and pattern for decoration, photo resists, displays, name plates, photoadhesives, photo-curable paints, UV-curable inks, ion exchange resins (films), selective transmission films, and stabilization enzyme films. For example, a relief plate is usually manufactured as follows: First, an original plate including a support on which a photosensitive resin composition layer is formed is exposed to light through a negative film or a positive film, whereby the photosensitive resin composition on the exposed portion is optically hardened and insolubilized. Then, the photosensitive resin composition which is not exposed to light is dissolved in an appropriate solvent and removed, thereby obtaining a relief plate. Among the above-mentioned components, properties of a soluble synthetic polymer are important. When the soluble synthetic polymer is used for a relief plate, the following requirements should be satisfied.

(1) The soluble synthetic polymer is soluble in an appropriate solvent.

(2) The surface of a composition layer formed on a support is contacted with a negative film for exposure to light and the photopolymerizable unsaturated compound on the exposed portion is photopolymerized and insolubilized.

(3) A relief plate obtained is excellent in transparency, abrasion resistance (printing resistance) and solvent resistance (ink solvent resistance).

Polyamides have been used as a soluble synthetic polymer which satisfies the above-mentioned requirements. In recent years, because of diversified uses of printing, there is a great demand for a wide variety of relief plates ranging from a high-hardness plate of about 80° in Shore D to a super-softness plate with impact resilience and with flexibility of about 40° in Shore A. In particular, impact resilience has become important in order to obtain stable printed matters when high speed printing is performed. Accordingly, flexibility and impact resilience have been required for soluble synthetic polymers.

As a soluble synthetic polymer which satisfies the above requirements, an addition polymer obtained by the reaction between a diamine compound having at least one amide bond and an organic diisocyanate compound has been proposed (Japanese Laid-Open Patent Publication No. 58-140737). This addition polymer is obtained by the addition-polymerization of the diamine compound which is a hard segment with an organic diisocyanate compound containing as a soft segment polyoxyalkylene glycol. Since this addition polymer is an elastomer having a block structure consisting of a hard segment and a soft segment, a relief plate obtained by using a composition comprising this addition polymer is excellent in flexibility and impact resilience. However, in the relief plate obtained by using a composition comprising this addition polymer, impact resilience is likely to change depending upon humidity. That is, the impact resilience is highly dependant on humidity. Thus, there is a problem in that when such a relief plate is used for printing, especially at high speed, stable printed matters cannot be obtained.

SUMMARY OF THE INVENTION

A photosensitive resin composition of the present invention, which overcomes the above-discussed and numerous other disadvantages and deficiencies of the prior art, comprises a soluble synthetic polymer, a photopolymerizable unsaturated compound, and a photopolymerization initiator; wherein the soluble synthetic polymer comprises an addition polymer obtained by the reaction between a diamine compound having amino groups selected from primary and secondary amino groups and having no amide bonds in its molecule and a diisocyanate compound; and the addition polymer contains a polyoxyalkylene glycol component.

In a preferred embodiment, the diamine compounds are a combination of at least one hydrophobic diamine and at least hydrophilic diamine.

In a preferred embodiment, the photosensitive resin composition comprises the soluble synthetic polymer in an amount of 25 to 95% by weight based on the total weight of the composition.

In a preferred embodiment, the polyoxyalkylene glycol component is contained in the addition copolymer in an amount of 20 to 80% by weight.

Thus, the invention described herein makes possible the objective of providing a photosensitive resin composition which can be used for a relief plate excellent in flexibility and impact resilience, which is less dependent upon humidity.

DESCRIPTION OF THE PREFERRED EMBODIMENTS

A photosensitive resin composition of the present invention comprises a soluble synthetic polymer, a photopolymerizable unsaturated compound, and a photopolymerization initiator. The soluble synthetic polymer used in the present invention comprises an addition polymer obtained by the reaction between a diamine compound having amino groups selected from primary and secondary amino groups and having no amide bonds in its molecule, and a diisocyanate compound.

As the diamine compound having primary amino groups and/or secondary amino groups and no amide bonds in its molecule, various kinds of well-known diamine compounds can be used. It is preferred that at least one hydrophobic diamine and at least one hydrophilic diamine are used together. Examples of hydrophilic diamine are represented by the following general formulas (I) to (VII). In particular, the diamine compound which is represented by the following formulas (I) to (V) and contains a basic tertiary nitrogen atom is preferred.

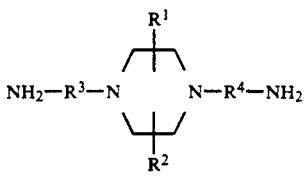 (I)

where $R^1$ and $R^2$ are independently hydrogen atoms or hydrocarbon residues with 1 to 10 carbon atoms, and $R^3$ and $R^4$ are independently alkylene groups with 1 to 15 carbon atoms.

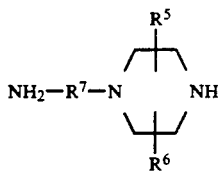 (II)

where $R^5$ and $R^6$ are independently hydrogen atoms or hydrocarbon residues with 1 to 10 carbon atoms, and $R^7$ is an alkylene group with 1 to 15 carbon atoms.

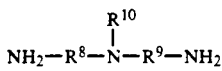 (III)

where $R^8$ and $R^9$ are independently alkylene groups with 1 to 15 carbon atoms, and $R^{10}$ is a hydrocarbon residue with 1 to 10 hydrocarbon atoms.

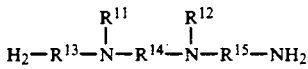 (IV)

where $R^{11}$ and $R^{12}$ are independently hydrogen atoms or hydrocarbon residues with 1 to 10 carbon atoms, and $R^{13}$, $R^{14}$, and $R^{15}$ are independently alkylene groups with 1 to 15 carbon atoms. Each alkylene group can contain a hydrocarbon residue with 1 to 10 carbon atoms as a side chain.

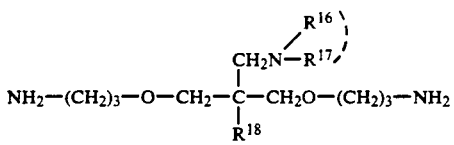 (V)

where $R^{16}$ and $R^{17}$ are hydrocarbon residues with 1 to 10 carbon atoms, and $R^{16}$ and $R^{17}$ can be bonded in a circle via or without a nitrogen atom, an oxygen atom, and a sulfur atom. $R^{18}$ is a lower alkyl group with 1 to 3 carbon atoms or

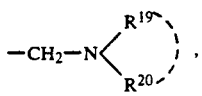

and $R^{19}$ and $R^{20}$ are the same as $R^{16}$ and $R^{17}$.

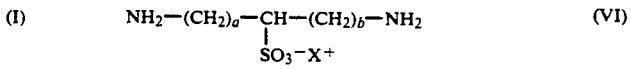 (VI)

where X is an alkaline metal or alkaline-earth metal, and a and b are independently integers from 1 to 4.

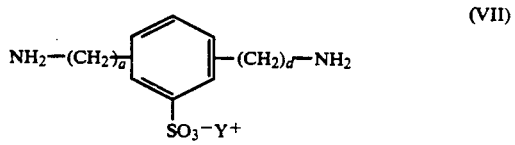 (VII)

where Y is an alkaline metal or alkaline-earth metal, and c and d are independently integers from 1 to 4.

Examples of hydrophilic diamine represented by the formula (I) include N,N'-bis(aminomethyl)piperazine, N,N'-bis($\beta$-aminoethyl)piperazine, N,N'-bis($\beta$-aminoethyl)methylpiperazine, N-(aminomethyl)-N'-($\beta$-aminoethyl)piperazine, and N,N'-bis($\gamma$-aminopentyl)piperazine.

Examples of hydrophilic diamine represented by the formula (II) include N-($\beta$-aminoethyl)piperazine, N-(aminopropyl)piperazine, N-($\omega$-aminohexyl)piperazine, N-($\delta$-aminocyclohexyl)piperazine, N-($\beta$-aminoethyl)-3-methylpiperazine, N-($\beta$-aminoethyl)-2,5-dimethyl piperazine, N-($\beta$-aminopropyl)-3-methylpiperazine, and N-($\gamma$-aminopropyl)-2,5-dimethylpiperazine.

Examples of hydrophilic diamine represented by the formula (III) include N,N-di($\beta$-aminoethyl)amine, N,N-di($\gamma$-aminopropyl)amine, N,N-di($\beta$-aminoethyl)methylamine, N,N-di($\gamma$-aminopropyl)ethylamine, N,N-di($\gamma$-aminopropyl)isopropylamine, N,N-di($\gamma$-aminopropyl)cyclohexylamine, N,N-di($\delta$-amino-n-butyl)amine, and N-methyl-N-($\beta$-aminoethyl)-1,3-propanediamine.

Examples of hydrophilic diamine represented by the formula (IV) include N,N'-dimethyl-N,N'-di($\gamma$-aminopropyl)ethylene diamine, N,N'-dimethyl-N,N'-di($\gamma$-aminopropyl)tetramethylene diamine, N,N'-diisobutyl-N,N'-di-($\gamma$-aminopropyl)hexamethylene diamine, N,N'-dicyclohexyl-N,N'-di-($\gamma$-aminopropyl)hexamethylene diamine, and N,N'-di-($\gamma$-aminopropyl)-2,2,4-trimethylhexamethylene diamine.

Examples of hydrophilic diamine represented by the formula (V) include 1,2-bis(3-aminopropoxy)-2-methyl-2-(N,N-dimethylaminomethyl)propane, 1,2-bis(3-aminopropoxy)-2-methyl-2-(N,N-diethylaminomethyl)propane, 1,2-bis(3-aminopropoxy)-2-ethyl-2-(N,N-dimethyl aminomethyl)propane, and 1,3-bis(3-aminopropoxy)-2-(N,N-dimethylaminomethyl)propane.

Examples of hydrophilic diamine represented by the formula (VI) include sodium-1,6-diamino-3-hexanesulfonate and potassium-1,6-diamino-3-hexanesulfonate.

Examples of hydrophilic diamine represented by the formula (VII) include sodium-3,5-dimethylaminobenzene sulfonate and potassium-3,5-dimethylaminobenzene sulfonate.

The addition polymer comprised in the composition of the present invention contains a polyoxyalkylene glycol component. In order to prepare this kind of compound, the diamine compound containing a polyoxyalkylene glycol component can be used. As for this type of diamine compounds, polyoxyalkylene glycol in which amino groups are substantially added to both terminals can be used. Polyoxyalkylene glycol used for preparing polyoxyalkylene glycol in which amino groups are added to both terminals will be described later. Amino groups can be introduced into the terminals of polyoxyalkylene glycol by the known method. For example, acrylonitrile is added to the terminal hydroxyl groups of polyoxyalkylene glycol and then is reduced by using hydrogen.

The above-mentioned hydrophilic diamine can be used alone or in combination.

The above-mentioned hydrophobic diamines are aliphatic diamines with 2 to 12 carbon atoms, the alicyclic diamines represented by the following general formula (VIII) or (IX), and the aromatic diamines represented by the following general formula (X) or (XI). Examples of hydrophobic diamine include ethylene diamine, diethylene diamine, trimethylene diamine, tetramethylene diamine, hexamethylene diamine, 2-methylpentamethylene diamine, undecamethylene diamine, dodecamethylene diamine, 2,2,4-trimethylhexamethylene diamine, 2,4,4-trimethylhexamethylene diamine, 1,3-bis-(aminomethyl)cyclohexane, 1,4-bis(aminomethyl)cyclohexane, 1,3-diaminocyclohexane, 1,4-diaminocyclohexane, bis(4,4'-aminocyclohexyl)methane, m-xylyene diamine, p-xylylene diamine, m-phenylene diamine, p-phenylene diamine, and bis(4,4'-aminophenyl)methane.

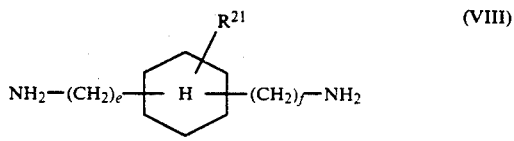

where $R^{21}$ is a hydrogen atom, a methyl group or an ethyl group, and e and f are independently integers from 0 to 3.

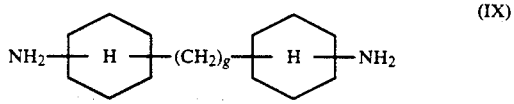

where g is an integer from 1 to 3.

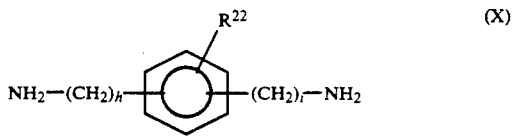

where $R^{22}$ is a hydrogen atom, a methyl group or an ethyl group, and h and i are independently integers from 0 to 3.

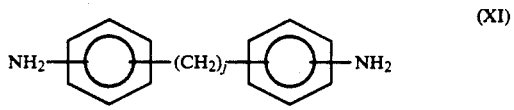

where j is an integer from 1 to 3.

The above-mentioned hydrophobic diamine can be used alone or in combination.

A relief plate obtained by using the composition comprising the addition polymer which contains the diamine compound having no amide bonds has lower hygroscopicity. Accordingly, humidity dependence of impact resilience of the relief plate is decreased.

Among the above addition polymers, when the hydrophilic diamine is used alone, and the composition layer is optically hardened and developed by using water, the developing property becomes satisfactory. However, since the relief plate obtained has hygroscopicity, humidity dependence of impact resilience of the relief plate is increased. On the contrary, when the hydrophobic diamine is used alone, and the composition layer is optically hardened and developed by using water, developing property becomes poor. In this case, since the relief plate obtained has no hygroscopicity, humidity dependence of impact resilience of the relief plate is decreased. Accordingly, when at least one hydrophilic diamine and at least one hydrophobic diamine are used together, the developing property of the composition layer developed by using water becomes satisfactory, and humidity dependence of impact resilience of the relief plate so obtained is decreased. Hydrophilic diamine is contained preferably in an amount of 20 to 90% by weight, more preferably 30 to 80% by weight based on the total weight of the diamine compounds. When hydrophilic diamine is contained in an amount of less than 20% by weight, the time required for the development is long. When hydrophilic diamine is contained in an amount of more than 90% by weight, humidity dependence of impact resilience is increased.

As a diisocyanate compound which is another material of the soluble synthetic polymer, known aliphatic, alicyclic, and aromatic diisocyanates can be used. Examples of these diisocyanate compounds include 2,4-tolylene diisocyanate, 2,6-tolylene diisocyanate, 4,4'-diphenylmethane diisocyanate, 4,4'-dicyclohexylmethane diisocyanate, dianisidine isocyanate, hexamethylene diisocyante, 3,3'-ditolylene-4,4'-diisocyanate, p-xylylene diisocyanate, 1,3-cyclohexanedimethyl isocyante, m-xylylene diisocyanate, 1,5-naphthalene diisocyanate, trans-vinylene diisocyanate, 2,6-diisocyanate methylcaproate, diphenylether-4,4'-diisocyanate and isophorone diisocyanate. The above-mentioned diisocyanate compound can be used alone or in combination.

In order to prepare the addition polymer containing a polyoxyalkylene glycol component, the diisocyanate compound containing a polyoxyalkylene glycol component can be used. This kind of compound can be a diisocyanate compound substantially having isocyanate groups on both terminals, obtained by reacting a diisocyanate compound with polyoxyalkylene glycol (described later) which is equimolar or less than the diisocyanate compound. Such a diisocyanate compound can be produced by the conventional methods. For example, there are methods in which a diisocyanate compound and polyoxyalkylene glycol are mixed and stirred without any solvents, or in which both of them are dissolved in inactive solvents. Reaction temperature and reaction time should be determined so as to obtain an optimum condition, taking into account the reactivity and thermal stability of both. The reaction ratio of both is not less than 2.0 mols, preferably not less than 2.05 mols as expressed in NCO/OH (equivalent ratio). It is permissible that the diisocyanate compound remains partly unreacted because of its excess addition, so far as there is no adverse effect on the subsequent reaction with the diamide compound of which both terminals are substantially amino groups.

As polyoxyalkylene glycol used for preparing the above-mentioned addition polymer, known polyoxyalkylene glycols can be used. Examples of this polyoxyalkylene glycol include polyoxyethylene glycol (having a molecular weight of 200 to 4,000), polyoxypropylene glycol (having a molecular weight of 200 to 4,000), polyoxytetramethylene glycol (having a molecular weight of 200 to 4,000), poly(oxyethylene-oxypropylene)glycol (having a molecular weight of 200 to 4,000), and poly(oxyethylene-oxytetramethylene)glycol (having a molecular weight of 200 to 4,000). These glycols can be used alone or in combination.

Instead of the above polyoxyalkylene glycol, any well-known glycol can be used as long as it will not influence flexibility, impact resilience and development property. Examples of such glycols include α, ω-1,2-polybutadiene glycol and its hydrogenated product, α, ω-1,4-polybutadiene glycol and its hydrogenated product, α, ω-1,4-polybutadiene/1,4-polybutadiene glycol and its hydrogenated product, polyesterdiols such as polyesters (including oligoesters) having a molecular weight of 200 to 4,000 of which both terminals are substantially hydroxyl groups, i.e. polyesters obtained from the well-known dicarboxylic acids and/or their diesters, glycols, oxyacids, etc., polycaprolactonediols and the like.

The above-mentioned polyoxyalkylene glycol is a soft segment in the addition polymer. Therefore, the addition polymer has a block structure consisting of a soft segment and a hard segment. As a result, the relief plate obtained by using a composition comprising this addition polymer has excellent flexibility and impact resilience. It is preferred that the polyoxyalkylene glycol component is contained in the addition polymer in an amount of 20 to 80% by weight. When the polyoxyalkylene glycol is contained in an amount of less than 20% by weight, flexibility and impact resilience of the relief plate obtained is unsatisfactory. In contrast, when the polyoxyalkylene glycol is contained in an amount of more than 80% by weight, mechanical strength and resistance to printing of the relief plate obtained is unsatisfactory.

The polyoxyalkylene glycol component contained in the addition polymer can be derived from either the diamine compound or the diisocyanate compound.

The addition polymer preferably contains a basic nitrogen atom in an amount of 0.2 meq/g or more. The addition polymer containing the basic nitrogen atom reacts on a quaternary agent to produce an ammonium salt type compound which is water-soluble. When the content of the basic nitrogen atom is less than 0.2 meq/g, the ammonium salt type compound obtained is not likely to be water-soluble. The basic nitrogen atom is derived from the above-mentioned hydrophilic diamine compound. As the quaternary agent, well-known compounds such as protic acids, metallic salts, and alkyl halogen compounds. Examples of protic acid include inorganic acids such as hydrochloric acid and sulfuric acid; and organic acids such as formic acid, acetic acid, chloroacetic acid, maleic acid, itaconic acid, phtalic acid, adipic acid, acrylic acid, and cinnamic acid.

The addition polymer is obtained by the addition polymerization between the diamine compound and the diisocyanate compound. As the addition reaction, there are methods in which the diisocyante compound is gradually added to the diamine solution directly or in a solution while stirring or in which the fused diisocyanate compound and the fused diamine compound are mixed and allowed to react with each other.

The ratio of the diamine compound to the diisocyanate compound (an amino group/an isocyanate group) is 1.0 or more, preferably 1.02 or more. In this case, it is permissible that the excess terminal amino group remains unreacted as long as it will not influence the performance and physical property of the composition obtained. When an amino group/an isocyanate group is less than 1.0, since undesired reactions such as a gelling is likely to occur, this ratio is not preferred. Reactivity between amino groups and isocyanate groups is great, so that this reaction is possible in water, alcohols such as methanol, or an active solvent such as a mixture of water and alcohols. Moreover, this reaction is rapidly completed. This reaction should be carried out under optimum conditions in accordance with the system. In particular, the reaction is rapidly effected at relatively low temperatures, for example at room temperature. Furthermore, in this reaction, the ratio between an amino group and an isocyanate group is varied, thereby readily regulating viscosity of a resulting polymer.

The content of the above addition polymer is preferably 50% by weight or more based on the soluble synthetic polymer. When the content is less than 50% by weight, the relief plate obtained by the composition comprising this soluble synthetic polymer has unsatisfactory flexibility and impact resilience.

The soluble synthetic polymer of the present invention can comprise other soluble synthetic polymers in addition to the addition polymer. Examples of soluble synthetic polymers include polyamide, polyester, silicon resin, polyurethane, and vinyl polymers such as polyvinyl acetate and polyvinyl alcohol. In addition to a homopolymer, these polymers can be a random copolymer, a block copolymer or a mixture thereof. The amount of these soluble synthetic polymers used is preferably less than 50% by weight based on the total weight of the soluble synthetic polymer.

In the present invention, the soluble synthetic polymer is preferably comprised in the composition in an amount of 25 to 95% by weight. When the content of the soluble synthetic polymer is less than 25% by weight, the relief plate obtained by using the composition comprising this soluble synthetic polymer has unsatisfactory mechanical strength. In contrast, when the content of the soluble synthetic polymer is more than 95% by weight, the layer of the composition has poor optical hardenability. As a result, when the relief plate so obtained is used to form an image, the image is likely to be unclear.

The photopolymerizable unsaturated compound used in the present invention refers to the compounds having one or more photopolymerizable unsaturated bonds in the molecules, and the well-known compounds may be used. Examples of such compounds are as follows:

(i) Compounds having one unsaturated bond: (meth)acrylic acid, maleic acid, fumaric acid, crotonic acid, itaconic acid, cinnamic acid, methyl(meth) acrylate, 2-hydroxyethyl(meth)acrylate, 2-hydroxypropyl (meth)acrylate, 3-chloro-2-hydroxypropyl(meth)acrylate, cyclohexyl(meth)acrylate, benzyl(meth)acrylate, N,N'-dimethylaminoethyl(meth)acrylate, monoester carboxylic acids obtained by the reaction between aliphatic dicarboxylic acids (or anhydrides thereof) and 2-hydroxylethyl(meth)acrylate, glycidyl(meth)acrylate, (meth)acrylamide, N-methylol(meth)acrylamide, N-methylol(meth)acrylamide-n-butyl ether, diacetacrylamide, N-tert-butyl(meth)acrylamide, sodium (meth)acrylate, ammonium(meth)acrylate, acrylonitrile, styrene, sodium styrenesulfonate, vinylpyridine, ring-opening addition products of glycidyl(meth)acrylate with a monoalcohol, 2-acrylamide-2-methylpropane sulfonic acid, etc.

(ii) Compounds having two or more unsaturated bonds: allyl(meth)acrylate, ethylene glycol di(meth)acrylate, 1,3-propanediol di(meth)acrylate, 1,4-butanediol di(meth)acrylate, 1,6-hexanediol di(meth)acrylate, trimethylolethane di(meth)acrylate, trimethylolethane tri(meth)acrylate, trimethylolpropane di(meth)acrylate, trimethylolpropane tri(meth)acrylate, tetramethylolmethane di(meth)acrylate, tetramethylolmethane tri (meth)acrylate, tetramethylolmethane tetra(meth)acrylate, tri(meth)acryloyloxyethyl phosphate, triester of tris(2-hydroxyethyl)isocyanuric acid with (meth)acrylic acid, ring-opening addition products between polyglycidyl ether of polyhydric alcohol and (meth)acrylic acid {such as, for example, reaction products between diglycidyl ether of (poly)ethylene glycol and (meth)acrylic acid, reaction products between glycidyl ether of (poly)propylene glycol and (meth)acrylic acid, reaction products between diglycidyl ether of 1,6-hexamethylene glycol and (meth)acrylic acid, reaction products between glycerin diglycidyl ether and (meth)acrylic acid, reaction products between trimethylolethane triglycidyl ether and (meth)acrylic acid, reaction products between trimethylolpropane triglycidyl ether and (meth)acrylic acid, reaction products between isophthalic acid diglycidyl ester and (meth)acrylic acid, and reaction products between diglycidyl ether of isoprene oligomer dicarboxylic acid and (meth)acrylic acid}, ring-opening addition products between other compounds having active hydrogen and glycidyl(meth)acrylate {such as, for example, reaction products between (poly)ethylene glycol and glycidyl(meth)acrylate, reaction products between (poly)propylene glycol and glycidyl(meth) acrylate, reaction products between glycerin and glycidyl (meth)acrylate, reaction products between 2-hydroxyethyl(meth)acrylate and glycidyl(meth)acrylate, reaction products between trimethylolethane and glycidyl(meth)acrylate, reaction products between trimethylolpropane and glycidyl(meth)acrylate, reaction products between (meth)acrylic acid and glycidyl(meth)acrylate, reaction products between aliphatic polycarboxlic acid and glycidyl(meth)acrylate, reaction products between aromatic polycarboxylic acid and glycidyl(meth) acrylate, and reaction products between compounds having a primary or secondary amino group and glycidyl(meth)acrylate, N,N'-methylenebis(meth)acrylamide, N,N'-ethylenebis(meth)acrylamide, N,N'-propylenebis(meth)acrylamide, N,N'-hexamethylenebis (meth)acrylamide, N,N'-m-phenylenebis(meth)acrylamide, N,N'-m-xylylenebis(meth)acrylamide, di(meth)acrylamide-N-methyl ether, 1,3-bis[(meth)acryloylaminomethylurea] and its derivatives, 1,3-bis[(meth)acryloylaminomethyl]-1,3-dimethylurea and its derivatives, 1,3-bis[(meth)acryloylaminomethyl]ethyleneurea and its derivatives, 1,3-bis[(meth)acryloylaminomethyl]trimethyleneurea and its derivatives, triacrylformal, tri(meth)acrylate of tris(2-hydroxyethyl)isocyanuric acid, 1,3-diglycidyl-5-methyl-5-ethylhydantoin.

The photopolymerizable unsaturated compound may be used alone or in a mixture of two or more kinds of the compound. The amount of the compound used is 5 to 200 parts by weight, more particularly 10 to 150 parts by weight based on 100 parts by weight of the soluble synthetic polymer in the composition. When the amount is less than 5 parts by weight, the optical hardenability of the composition is unsatisfactory, and the composition is likely to dissolve in solvents during development. When the amount is more than 200 parts by weight, the mechanical strength of the relief plate so obtained by using the composition becomes low.

The photopolymerization initiator used in the present invention is a compound to initiate, promote or strengthen the polymerization of the foregoing photopolymerizable unsaturated compound within the composition, and the conventionally well-known compounds may be used. As examples of such a compound, there may be given for example benzophenones such as benzophenone, p-aminobenzophenone, p-chlorobenzophenone, etc., anthraquinones such as 9,10-anthraquinone, 1-chloroanthraquinone, 2-chloroanthraquinone, etc., benzoins such as bezoin, bezoin methyl ether, benzoin ethyl ether, benzoin isopropyl ether, α-methylbenzoin, etc., benzils such as benzil, benzil dimethyl ketal, etc., other compounds such as benzil libomethylvin, uranyl nitrate, halogen compounds, sulfur compounds and the like.

The amount of the photopolymerization initiator used is not particularly limited, but it is 0.01 to 10% by weight, more particularly 0.05 to 5% by weight based on the total weight of composition. These compounds may be used alone or in a mixture of two or more of them.

The well-known thermal polymerization inhibitor may be added if necessary. This inhibitor is added for the purpose of preventing the photopolymeriable unsaturated compound from unfavorable thermal polymerization caused by heating on the compounding, production and molding of the composition, or of preventing the composition from dark reaction on storage. As examples of such a compound, there may be given for example hydroquinones such as hydroquinone, mono-tert-butylhydroquinone, 2,5-di-tert-butylhydroquinone, hydroquinone monomethyl ether, etc., benzoquinones such as bezoquinone, 2,5-diphenyl-p-benzoquinone, etc., phenols, catechols such as catechol, p-tert-butyl-catechol, etc., aromatic amines, pioric acids, phenothiazine, α-naphthoquinones, anthraquinones, nitro compounds, sulfur compounds and the like. The amount of the inhibitor used is 0.001 to 2% by weight, particularly preferably 0.005 to 1% by weight of the total weight of composition. These compounds may be used alone or in a mixture of two or more of them.

When the relief plate for printing is produced by using the composition of the present invention, a surface tack eliminator can be comprised for the purpose of eliminating tack of the relief plate surface. As the surface tack eliminator, a liquid compound is generally used. It is preferred that this surface tack eliminator has a high compatibility with other components comprised in the composition which is not hardened yet, and has low compatibility with other components comprised in the composition which has already been optically hardened. When such a surface tack eliminator is comprised in the composition, this surface tack eliminator neither separates from other components nor migrates into the surface of the photosensitive resin composition layer before the composition is optically hardened because of the satisfactory compatibility between this surface tack eliminator and the other components. On the other hand, this surface tack eliminator separates from the other components to migrate into the surface of the photosensitive resin composition layer to form a film after the composition is optically hardened, since the compatibility between this surface tack eliminator and the other components are decreased. Therefore, the tack of the surface of the relief plate disappears.

The surface tack eliminator is selected depending upon the soluble synthetic polymer and photopolymerizable unsaturated compound comprised in the composition. Ester compounds having one or more ester groups in molecules and amine compounds with polyalkylene glycol adducts can be used. Examples of ester compounds having one or more ester groups in molecules include the compounds represented by the following general formulas (XII) to (XVIII).

(XII)

where $R^{23}$ is an alkyl group with 3 to 20 carbon atoms, $R^{24}$ is a hydrogen atom or a methyl group, and k is an integer from 1 to 25.

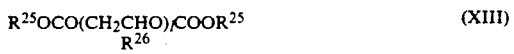

(XIII)

where $R^{25}$ is an alkyl group with 3 to 20 carbon atoms, $R^{26}$ is a hydrogen atom or a methyl group, and l is an integer from 1 to 15.

(XIV)

where $R^{27}$ is an alkyl group with 3 to 18 carbon atoms, and m is an integer from 1 to 10.

(XV)

where $R^{28}$ is an alkyl group with 3 to 18 carbon atoms, and $R^{29}$ is a substituted or a non-substituted cyclohexane ring, benzene ring, or naphthalene ring.

(XVI)

where $R^{30}$ is an alkyl group with 3 to 18 carbon atoms, and $R^{31}$ is a substituted or a non-substituted cyclohexane ring, benzene ring or naphthalene ring.

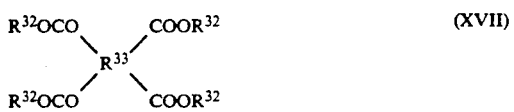

(XVII)

where $R^{32}$ is an alkyl group with 3 to 18 carbon atoms, and $R^{33}$ is a substituted or a non-substituted cyclohexane ring, benzene ring or naphthalene ring.

(XVIII)

where $R^{34}$ is an alkyl group with 3 to 18 carbon atoms, $R^{35}$ is an alkyl group with 2 to 15 carbon atoms, P is an integer from 3 to 10, and q is an integer from 2 to 10.

Examples of the above amine compounds with polyalkylene glycol adducts include the compound represented by the following general formula (XIX):

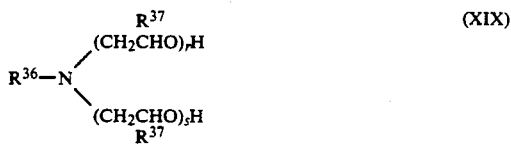

(XIX)

where $R^{36}$ is an alkyl group with 3 to 20 carbon atoms, $R^{37}$ is a hydrogen atom or a methyl group, r and s are integers in which r+s is an integer from 1 to 20.

These compounds may be used alone or in a mixture of two or more of them. It is preferred that these compounds are selected, taking the compatibility between the resin components comprised in the composition and the surface tack eliminator after the composition is optically hardened and tack elimination effects of the surface of the relief plate obtained into consideration.

The content of the surface tack eliminator is selected depending upon the kinds and the amounts of soluble synthetic polymers and photopolymerizable unsaturated compounds. It is preferably 0.1 to 5.0% by weight, more preferably 0.5 to 4.0% by weight. When the content is less than 0.1% by weight, the tack elimination effects of the relief plate surface is not satisfactory. When the content is more than 5.0% by weight, the tack elimination effects of the relief plate surface is satisfactory, but the compound breeds out of the surface of the photosensitive resin composition layer while being preserved until an image is formed. As a result, a film covering the surface is peeled off. Moreover, the mechanical strength of the relief plate obtained is decreased.

To the composition of the present invention may be added other additives such as plasticizers, pigments, dyes, stabilizers, etc., insofar as they do no special damage to the photosensitive performance, physical property, etc. of the composition.

Mixing of the soluble synthetic polymer, photopolymerizable unsaturated compound and photopolymerization initiator of the present invention and if necessary the thermal polymerization inhibitor, the surface tack eliminator and other additives such as plasticizers may be carried out according to well-known optional methods. For example, there is a method in which the soluble synthetic polymer and the photopolymerizable unsaturated compound are heated to a predetermined temperature so as to be in a molten state and the respective components are mixed, and a method in which the respective components are dissolved in a suitable solvent such as alcohol to be mixed and the solvent is removed. Also, the composition of the present invention can be formed into a sheet such as plates, films, foils, etc. having a desired thickness by the well-known optional methods such as heat pressing, casting, melt extrusion, solution casting and the like. This sheet may be laminated on a support with or without a well-known adhesive therebetween. As to the support, optional ones such as steel, aluminum, glass, plastic films such as polyester film, vaporized metaldeposited film and the like may be used.

A photosensitive original plate comprising a simple layer of this composition, or this layer and a support when its composition layer is closely contacted with a negative or positive film having a transparent image portion, and is exposed by irradiation with active ray from the film, hardens and turns insoluble with respect to solvents at only the exposed portion. Thereafter, by dissolving and removing the non-exposed portion by means of a suitable solvent, the relief plate having a distinct image portion can be obtained.

When the layer of the composition of the present invention is formed on the support, the composition layer can be a single layer or multi-layered. When the layer is multi-layered, the shape of the surface of the relief plate can be sharpened by making the photosensitivity of the surface layer different from that of the lower layer. In this case, when the reproductivity of the negative is taken into consideration, it is preferred that the photosensitivity of the surface layer is 50% or less with respect to that of the lower layer. Moreover, the thickness of the surface layer is preferably 50% or less with respect to the entire thickness of the composition layer.

These are the following methods for forming a multi-layer composition layer on the support.

(1) A method comprising the steps of molding the composition layers each having different photosensitivity into sheets, superimposing these layers one on top of the other, and heat-treating them at about 100° C. so that both layers come into contact with each other.

(2) A method for superimposing a polymer layer comprising a compound capable of lowering photosensitivity on the composition layer by means of heat pressing, casting, melt extrusion, solution casing and the like. These two layers form a photosensitive resin composition layer. According to this method, the photopolymerization initiator, the photopolymerizable unsaturated compound and the like on the lower layer of the photosensitive resin composition layer migrate into the upper layer of the photosensitive resin composition layer. As a result, the photosensitivity of the upper portion of the composition layer is decreased, and two composition layers each having different photosensitivity can be obtained. Because of this, this method is industrially preferred.

Moreover, the photosensitivity can be regulated by using a UV-absorbent and additives such as photosensitivity balance agent. Taking the stability of the photosensitivity into consideration, the photosensitivity balance agent is preferably used.

As a suitable solvent for dissolving and removing the non-exposed portion, these may be given for example, water, various aqueous acid solutions, aqueous alkali solutions, lower aliphatic alcohols, and mixed solutions such as water/alcohol mixtures, water/alcohol/benzene mixtures, mixtures of a lower alcohol with calcium chloride or zinc chloride, etc.

Next, the present invention will be described with reference to the examples and comparative examples, but it is not to be interpreted as being limited to these examples. The hardness, impact resilience, developing time, and adhesion of the surface of the relief plate obtained by the photosensitive resin composition of the present invention were measured by the following methods.

Hardness: measured by the spring type hardness test (A type) in accordance with JIS-K6301 at 20° C.

Impact resilience indicated as (a/20) x 100%: measured by dropping a ball made of steel, having a diameter of 10 m/m (weight 4.16 g) from a height of 20 cm to the ground and reading the height (a) in which the ball rebounds.

Developing time: measured by developing the composition using a brush type washer (brush: 120 $\mu\phi$ nylon brush) comprising neutral water at 25° C. and calculating the time required for removing the nonexposed portion. As the brush type washer, a washer for A2 size (JW-A2-PD) produced by Nihon Denshi Seiki Co., Ltd. was used.

Surface tack: measured by superimposing a PET film with a thickness of 125 $\mu$m on a relief plate at 20° C., applying a load of 50 g/cm onto the film, allowing the film to stand for 10 min., peeling off the PET film at a predetermined speed of 500 mm/min. and calculating the force required for peeling off the PET film per 1 $cm^2$.

EXAMPLE 1

First, 87 parts by weight of N,N'-bis(3-aminopropyl)-piperazine (diamine) was dissolved in 600 parts by weight of methanol. 500 parts by weight of polyethylene glycol (average molecular weight, 1,000) was allowed to react with 185 parts by weight of hexamethylene diisocyanate to obtain an urethane oligomer having isocyanate groups at both terminals thereof. 353 parts by weight of this urethane oligomer was gradually added to the methanol solution of diamine while stirring. The reaction was completed in about 10 min. This reaction mixture was spread on a Teflon-coated Schale, and after evaporation-removal of the methanol, dried under reduced pressure so as to obtain an addition polymer. This addition polymer was water-soluble and contains 51.0% by weight of polyether segment in the main chain. This addition polymer had a specific viscosity of 1.80, a resin hardness of 75° in Shore A, and impact resilience of 41%.

Next, 55 parts by weight of this addition polymer so obtained was dissolved in 200 parts by weight of methanol. To this solution, 29 parts by weight of diacrylate obtained by the ring-opening addition reaction between glycidyl ether of polyethylene glycol (having an average molecular weight of 400) and acrylic acid, 15 parts by weight of N-butyl-benzenesulfonamide, 0.1 parts by weight of hydroquinone monomethyl ether, and 1.0 part by weight of benzyl dimethyl ketal were added to obtain a photosensitive resin composition.

This solution was spread on a Teflon-coated Schale, and after evaporation-removal of the methanol in a dark place, the solution was dried at 40° C. under reduced pressure for further whole day and night to obtain a sheet of composition having a thickness of about 800 $\mu$m. This sheet was stuck on a polyester film of 250 $\mu$m in thickness with a brown pigment-containing adhesive coated on the film, the upper surface of the composition was covered with a polyester film of 125 $\mu$m in thickness and the whole was heat-pressed at 110° C. to prepare a photosensitive resin original plate of which the composition layer had a thickness of about 700 $\mu$m. Thereafter, the covering film was peeled off from the original plate, and to the surface of the photosensitive resin layer was closely stuck a halftone negative film of 150 line/inch. After exposure to a chemical lamp for 3 min., the negative film was peeled off from the composition layer, and the exposed composition layer was developed for 2 min. and 25 sec. with neutral water by a brush type washer, followed by drying and post exposure. The relief plate obtained was faithful reproduction of the original image. This relief plate had a hardness of 70° in Shore A, an impact resilience of 40%, and humidity dependence of the impact resilience of 3%. This relief plate had an excellent property as an ultra-soft plate.

COMPARATIVE EXAMPLE 1

First, 400 parts by weight of N,N'-bis(3-aminopropyl)piperazine and 202 parts by weight of sebacic acid were melt-polycondensed in an autoclave to obtain an amide compound (molecular weight, about 570) being soluble in alcohol and substantially having amino groups at both terminals. 150 parts by weight of this amide compound was dissolved in 800 parts by weight of methanol. 500 parts by weight of polyethylene glycol (average molecular weight, 1,000) was allowed to react with 285 parts by weight of hexamethylene diisocyanate to obtain an urethane oligomer substantially having isocyanate groups at both terminals. 290 parts by weight of this urethane oligomer was gradually added to the methanol solution of the amide compound while stirring. From this solution, an addition polymer was obtained by using the same method as in Example 1. This addition polymer contained 48% by weight of polyether segment in the main chain thereof, and had a resin hardness of 75° in Shore A and an impact resilience of 35%.

A photosensitive resin original plate was prepared by using the addition polymer so obtained in accordance with the same method as in Example 1. Next, a relief plate was obtained in the same way except that the developing time was 2 min. and 30 sec. This plate was a faithful reproduction of the original image. This plate had a hardness of 76° in Shore A, an impact resilience of 30%, and humidity dependence of the impact resilience of 10%. As is apparent from the result, the humidity dependence of the impact resilience was large.

COMPARATIVE EXAMPLE 2

First, 500 parts of ε-caprolactam, 575 parts by weight of a nylon salt obtained from 270 parts by weight of N-(2-aminoethyl)piperazine and 305 parts by weight of adipic acid, and 40 parts by weight of N-(2-aminoethyl)-piperazine as an agent which makes the terminals amino groups (also acting as a viscosity stabilizer) were melt-polycondensed in an autoclave to obtain a copolymerized nylon oligomer (average molecular weight, about 3,050) substantially having primary and/or secondary amino groups at both terminals. This oligomer was a pale yellow and transparent copolymerized nylon having a specific viscosity of 1.40 and being soluble in alcohol.

Separately from the above, 750 parts by weight of polypropylene glycol (average molecular weight, 1,000) was allowed to react with 300 parts by weight of hexamethylene diisocyanate to obtain an urethane oligomer substantially having isocyanate groups at both terminals. Then, 92 parts by weight of the copolymerized nylon oligomer was dissolved in 200 parts by weight of methanol. 18 parts by weight of this urethane oligomer was gradually added to this solution at 50° C. The reaction was completed in about 15 min. This reaction solution was pale yellow and transparent, having a viscosity of about 180 poises. This solution was spread on a Teflon-coated Schale, and after evaporation-removal of the methanol a polymer was obtained. The polymer so obtained had amide, urethane, and urea bonds within the molecule. This polymer was pale yellow, transparent, flexible, and elastic and had a melting point of about 85° to 95° and a specific viscosity of 2.20.

Next, 55 parts by weight of the polymer obtained was dissolved in 100 parts by weight of methanol. 4 parts by weight of adipic acid (which makes the above polymer water-soluble by forming quaternary salts together with the basic tertiary nitrogen atom of the piperazine ring in the main chain of the polymer and with the terminal amino groups of the polymer), 20 parts by weight of hydroxyethylmethacrylate, 20 parts by weight of triethylene glycol diacrylate, 0.1 parts by weight of hydroquinone monomethyl ether, and 1.0 part by weight of benzoinmethyl ether were added to this solution to obtain a solution of a photosensitive resin composition.

A relief plate was obtained in the same manner as in Example 1 except that this solution was used, the temperature of the heat press was 100° C., the exposure time was 4 min. and the developing time was 2 min. and 15 sec. The relief plate so obtained was a faithful reproduction of the original image, and had both flexibility and good printability. The hardness of the relief layer was about 85° in Shore A. This relief plate had an impact resilience of 26%, and a humidity dependence of the impact resilience of 10%. Accordingly, this plate was not suitable for a high-speed printing.

EXAMPLE 2

First, 45.0 parts by weight of N,N'-bis(3-aminopropyl)piperazine and 31.0 parts by weight of 1,3-bis-(aminomethyl)cyclohexane were dissolved in 800 parts by weight of methanol. 600 parts by weight of polyethylene glycol was allowed to react with 370 parts by weight of hexamethylene diisocyanate to obtain an urethane oligomer. 364 parts by weight of the urethane oligomer was gradually added to the methanol solution while stirring. An addition polymer was obtained from this solution in the same manner as in Example 1. The addition polymer contained 54.0% by weight of polyether segment in the main chain thereof and had a specific viscosity of 1.76, a resin hardness of 72° in Shore A, and an impact resilience of 38%.

A photosensitive resin original plate was prepared from this polymer in the same manner as in Example 1. Then, a relief plate was obtained in the same manner as in Example 1 except that the developing time was 4 min. and 30 sec. The relief plate was a faithful reproduction of the original image. This relief plate had a hardness of 68° in Shore A, an impact resilience of 35%, and a humidity dependence of the impact resilience of 2%. This relief plate had excellent properties such as flexibility and rubber elasticity. Accordingly, this relief plate was excellent ultra-soft plate.

EXAMPLE 3

First, 55 parts by weight of polymer obtained in Example 2 was dissolved in 100 parts by weight of methanol. Then, to this solution, 1.2 parts by weight of adipic acid (which makes the above polymer water-soluble by forming quaternary salts together with the basic nitrogen stom of the piperazine ring in the main chain of the polymer and with the terminal amino groups of the polymer), 28.9 parts by weight of diacrylate obtained by the ring-opening reaction of a diglycidyl ether of polyethylene glycol (average molecular weight, 400) with acrylic acid, 15 parts by weight of N-butylsulfoneamide, 0.1 parts by weight of hydroquinone monomethyl ether, and 1.0 part by weight of benzyl dimethyl ketal were added to obtain a photosensitive resin composition.

By using this solution, a relief plate was obtained in the same manner as in Example 1 except that the exposure time was 2 min. The relief plate was a faithful reproduction of the original image. This relief plate had a hardness of 65° in Shore A, an impact resilience of 30%, and a humidity dependence of the impact resilience of 2%. This relief plate was excellent as an ultra-soft plate.

EXAMPLE 4

First, 50 parts by weight of 2-methyl pentamethylene diamine was dissolved in 700 parts by weight of methanol. 500 parts by weight of polyethylene glycol (average molecular weight, 600) was allowed to react with 185 parts by weight of hexamethylene diisocyanate to obtain an urethane oligomer substantially having isocyanate groups at both terminals. To the methanol solution, 347 parts by weight of this urethane oligomer was gradually added while stirring. The reaction was completed in about 10 min. From this solution, an addition polymer was obtained in the same manner as in Example 1. This addition polymer contained 63.8% by weight of polyether segment in the main chain thereof and had a specific viscosity of 1.65, a resin hardness of 78° in Shore A, and an impact resilience of 34%. This polymer was water-soluble.

By using the polymer so obtained, a photosensitive resin plate was prepared in the same manner as in Example 1. A relief plate was obtained in the same manner as in Example 1 except that the developing time was 4 min. and 15 sec. The relief plate so obtained was a faithful reproduction and had a hardness of 76° in Shore A, an impact resilience of 35%, and a humidity dependence of 2% of the impact resilience. This relief plate was excellent as an ultra-soft plate.

EXAMPLE 5

First, acrylonitrile was added to both terminals of polyethylene glycol (average molecular weight, 600), followed by hydrogen-reproduction to obtain α, ω-diaminopolyoxyethylene. Then, 50 parts by weight of α, ω-diaminopolyoxyethylene and 20 parts by weight of 2-methyl pentamethylene diamine were dissolved in 600 parts by weight of methanol. Next, 500 parts by weight of polyethylene glycol (average molecular weight, 600) was allowed to react with 185 parts by weight of hexamethylene diisocyanate to obtain an urethane oligomer substantially having isocyanate groups at both terminals. To the methanol solution, 199 parts by weight of this urethane oligomer was gradually added while stirring. From this solution, an addition polymer was obtained in the same manner as in Example 1. This addition polymer contained 56.5% by weight of polyether segment in the main chain thereof and had a specific viscosity of 1.62, a resin hardness of 73° in Shore A, and an impact resilience of 32%. This polymer was water-soluble.

By using the polymer so obtained, a photosensitive resin original plate was prepared in the same manner as in Example 1, and then a relief plate was obtained in the same manner as in Example 1 except that the developing time was 2 min. and 45 sec. The relief plate so obtained was a faithful reproduction of the original image. This relief plate had a hardness of 72° in Shore A, an impact resilience of 29%, and a humidity dependence of an impact resilience of 2%. This relief plate was excellent as an ultra-soft plate.

EXAMPLES 6 to 10

The compositions of the soluble synthetic polymer were varied as shown in Table 1, and relief plates were obtained in the same manner as in Example 3. As shown in Table 1, all relief plates were excellent in flexibility and impact resilience and had small humidity dependence of the impact resilience.

TABLE 1

| | Example 6 | Example 7 | Example 8 | Example 9 | Example 10 |
|---|---|---|---|---|---|
| Filling Polymer | | | | | |
| Diamine (Composition Ratio) | BAPP[a]/BAC[b] (60/40) | BAPP/BAC (60/40) | BAPP/BAC (60/40) | Bapp/TMD[c] (60/40) | AEP[d]/BAC (60/40) |
| Organic Diisocyanate Compound | Reaction Product between Polyoxyethylene Glycol (Having a Molecular Weight of 600) and Hexamethylene Diisocyanate | Reaction Product between Polyoxyethylene Glycol (Having a Molecular Weight of 1000) and Hexamethylene Diisocyanate | Reaction Product between Poly (oxyethylene-oxypropylene) Glycol (Having 70% By Mol of Oxyethylene Glycol Component and a Molecular Weight of 600) and Hexamethylene Diisocyanate | Reaction Product between Polyoxyethylene Glycol (Having a Molecular Weight of 600) and Hexamethylene Diisocyanate | Reaction Product between Polyoxyethylene Glycol (Having a Molecular Weight of 600) and Hexamethylene Diisocyanate |
| Content of a Glycol Component (% by Weight) | 53.1 | 62.4 | 54.0 | 51.2 | 54.5 |
| Specific Viscosity of a Filling Polymer (Methanol) | 1.65 | 1.76 | 1.72 | 1.68 | 1.73 |
| Properties of a Relief Plate | | | | | |
| Developing Time | 3'15" | 2'30" | 3'45" | 3'00" | 3'00" |
| Reproductivity | 150 lines/inch or more | 150 lines/inch or more | 150 lines/inch or more | 150 lines/inch or more | 150 lines/inch or more |
| Hardness (Shore A) | 68 | 55 | 65 | 65 | 60 |
| Impact Resilience (%) | 32 | 40 | 32 | 30 | 29 |

TABLE 1-continued

| | Example 6 | Example 7 | Example 8 | Example 9 | Example 10 |
|---|---|---|---|---|---|
| Humidity Dependence of Impact Resilience | 3 | 2 | 3 | 2 | 2 |

[a] N,N'-bis(3-aminopropyl) piperazine
[b] 1,3-bis(aminomethyl) cyclohexane
[c] 2,2,4/2,4,4-trimethylhexamethylene amine
[d] N-(2-aminoethyl) piperazine
[e] Impact resilience obtained by subtracting 32% RH from impact resilience when humidity dependence (20° C.) = 67% RH.

EXAMPLE 11

A relief plate was obtained in the same manner as in Example 2 except that 1.0 part by weight of adipic acid diisononyl ester was added to the photosensitive resin composition solution. The relief plate so obtained was a faithful reproduction of the original image. The surface tack of the plate was 3.0 g/cm².

EXAMPLE 12

A relief plate was obtained in the same manner as in Example 2 except that 1.0 part by weight of sebacic acid dioctyl ester was added to the photosensitive resin composition solution. The relief plate so obtained was a faithful production of the original image. The surface tack of the plate was 2.5 g/cm².

EXAMPLE 13

A relief plate was obtained in the same manner as in Example 2 except that 1.0 part by weight of futhalic acid dihexyl ester was added to the photosensitive resin composition solution. The relief plate so obtained was a faithful reproduction of the original image. The surface tack of the plate was 5.3 g/cm².

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

We claim:

1. A photosensitive resin composition comprising a soluble synthetic polymer, a photopolymerizable unsaturated compound, and a photopolymerization initiator; wherein said soluble synthetic polymer comprises an addition polymer obtained by the reaction between diamine compounds having amino groups selected from primary and secondary amino groups and having no amide bonds in their molecules and a diisocyanate compound; wherein said addition polymer contains a polyoxyalkylene glycol component and said diamine compounds are a combination of at least one hydrophilic diamine and at least one hydrophobic diamine.

2. A photosensitive resin composition according to claim 1, comprising said soluble synthetic polymer in an amount of 25 to 95% by weight based on the total weight of the composition.

3. A photosensitive resin composition according to claim 1, wherein said polyoxyalkylene glycol component is contained in said addition copolymer in an amount of 20 to 80% by weight.

* * * * *

UNITED STATES PATENT AND TRADEMARK OFFICE
CERTIFICATE OF CORRECTION

PATENT NO.  :  5,204,223
DATED       :  April 20, 1993
INVENTOR(S) :  YUJI TAGUCHI AND TOSHIAKI FUJIMURA It is certified that error appears in the above-identified patent and that said Letters Patent is hereby corrected as shown below:

Column 7, line 17, delete "ω-1,4-polybutadiene/1,4-polybutadiene" and substitute therefor -- ω-1,2-polybutadiene/1,4-polybutadiene --;

Column 10, line 17, after "etc.," delete "benzoins" and substitute therefor -- bezoins --; and Column 16, line 59, delete "stom" and substitute therefor -- atom --.

Signed and Sealed this

Eighth Day of March, 1994

*Attest:*

BRUCE LEHMAN

*Attesting Officer*    *Commissioner of Patents and Trademarks*